(12) United States Patent
Lee et al.

(10) Patent No.: US 7,144,538 B2
(45) Date of Patent: *Dec. 5, 2006

(54) METHOD FOR MAKING A DIRECT CHIP ATTACH DEVICE AND STRUCTURE

(75) Inventors: Yeu Wen Lee, Seremban (MY); Chuan Kiak Ng, Negei Sembilan (MY); Guan Keng Quah, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 398 days.

This patent is subject to a terminal disclaimer.

(21) Appl. No.: 10/603,257

(22) Filed: Jun. 26, 2003

(65) Prior Publication Data

US 2004/0262811 A1    Dec. 30, 2004

(51) Int. Cl.
*B29C 45/14*  (2006.01)
*H01L 21/56*  (2006.01)

(52) U.S. Cl. ............... 264/272.11; 264/272.17; 264/273; 264/279.1; 264/328.1; 438/108; 438/112; 438/118; 438/122; 438/123; 438/127

(58) Field of Classification Search ............. 264/271.1, 264/272.11, 272.17, 273, 279.1, 328.1; 438/108, 438/112, 118, 122, 123, 127
See application file for complete search history.

(56) References Cited

U.S. PATENT DOCUMENTS 5,766,972 A * 6/1998 Takahashi et al. .......... 438/127
6,081,997 A * 7/2000 Chia et al. .................. 29/841
6,436,736 B1 * 8/2002 Embong et al. ............ 438/125
6,660,565 B1 * 12/2003 Briar .......................... 438/122
6,780,746 B1 * 8/2004 Kinsman et al. ........... 438/612

FOREIGN PATENT DOCUMENTS

JP    2001-230520 A *  8/2001

* cited by examiner

*Primary Examiner*—Stefan Staicovici
(74) *Attorney, Agent, or Firm*—Kevin B. Jackson

(57) ABSTRACT

A method for forming a direct chip attach device (1) includes attaching an electronic chip (3) to a lead frame structure (2), which includes a flag (18). Next, conductive studs (22) are attached to bond pads (13) on electronic chip (3) and flag (18) to form a sub-assembly (24). Sub-assembly (24) is then placed in a molding apparatus (27,47), which includes a first plate (29,49) and second plate (31,51). Second plate (31,51) includes a cavity (32,52) for receiving electronic chip (3) and flag (18), and pins (36,56). During a molding step, pins (36,56) contact conductive studs (22) to prevent encapsulating material (4) from covering studs (22). This forms openings (6) to receive solder balls (9) during a subsequent processing step.

17 Claims, 5 Drawing Sheets

METHOD FOR MAKING A DIRECT CHIP ATTACH DEVICE AND STRUCTURE

BACKGROUND OF THE INVENTION

This invention relates, in general, to electronic device packaging, and more specifically to methods and apparatus for forming interconnects in flip-chip packages.

Flip-chip microelectronic packaging technology has been in existence for more than 30 years, and involves a direct electrical connection of downward facing (hence, "flipped") electronic components or chips to substrates, circuit boards, or carriers. The electrical connection is made through conductive bumps or balls connected to bond pads on both the chip and the substrate. In contrast, wire bonding, which is an older technology, uses upward facing chips with a wire connection between each bond pad and a corresponding lead or pin on a lead frame.

Flip-chip components are predominantly semiconductor devices. However, components such as passive filters, detector arrays, and sensor devices are also beginning to be used in flip-chip form. Flip-chip is also referred to as Direct Chip Attach (DCA), a more descriptive term, because the chip is-directly attached to a substrate, circuit board, or carrier by conductive bumps.

Although flip-chip technology has progressed to include a wide variety of materials and methods for bumping, attaching and underfilling devices, challenges still exist in solving problems with tighter space requirements, reduced costs, and enhanced device performance and reliability.

Accordingly, a need exists for improved structures and processes for forming flip-chip type packages.

DETAILED DESCRIPTION OF THE DRAWINGS

In general, the present invention pertains to a method for forming openings in molded direct chip attach (DCA) structures for connecting solder bumps to an encapsulated device. In particular, an electronic chip is attached to a lead frame structure and a conductive bump is attached to a bond pad on a surface of the chip. The lead frame substrate and electronic chip are then encapsulated in a mold cavity. During the encapsulation step, pins, studs or protrusions within the mold cavity contact the conductive bumps to prevent encapsulating material from forming over the conductive bumps to provide openings. In a further step, solder balls are attached to the conductive bumps through the openings.

Currently, DCA devices are manufactured as follows. An electronic chip is attached to a lead-frame structure. Next, the chip is encapsulated with a passivation material or mold compound using conventional injection-molding techniques. After the molding process is complete and the devices are removed from the molding apparatus, openings are formed in the outer surface of the molded device to expose contact areas on the electronic chip. Solder balls are then attached to provide interconnects between the encapsulated chip and a next level of assembly.

One approach to forming openings in the outer surface of the molded device uses laser burning. Laser burning has several disadvantages including long process times, expensive equipment, and cumbersome techniques to provide proper alignment. Chemical etching is another technique used to form openings. This technique requires specialized chemicals that are very expensive and hazardous. Additionally, chemical etching techniques are time consuming and require expensive processing equipment.

The present invention is better understood by referring to FIGS. 1–8 together with the following detailed description. For ease of understanding, like elements or regions are labeled the same throughout the detailed description and FIGURES.

Figure 1:
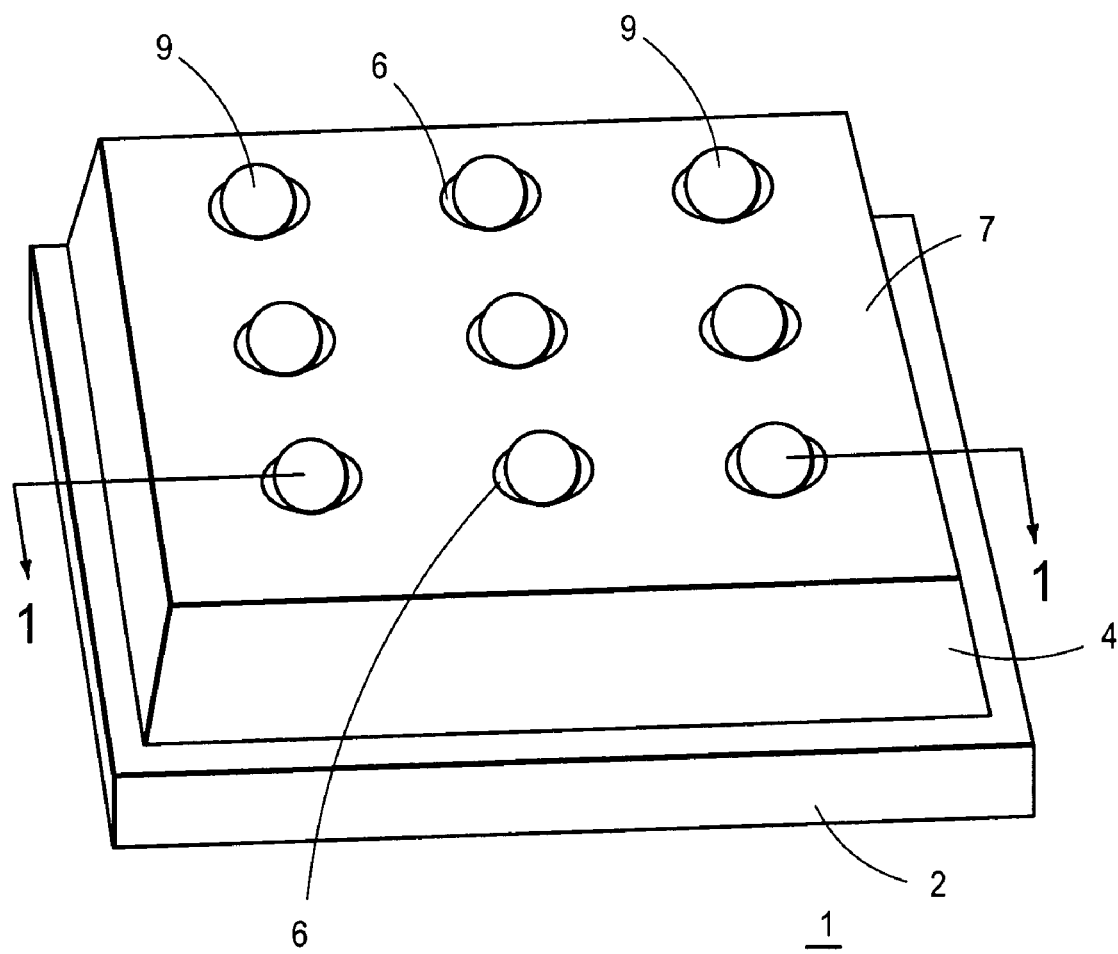
FIG. 1 illustrates, an enlarged isometric view of a direct chip attach device manufactured according to the present invention.

FIG. 1 shows an enlarged isometric view of a DCA device or structure 1 manufactured according to a method described in FIGS. 2–7. DCA device 1 includes a lead frame or support substrate 2, an electronic chip, device or component 3 (shown in FIG. 2), and encapsulant or protective layer 4 having openings 6 formed in upper surface 7. Solder or conductive balls, spheres, or bumps 9 are coupled to chip 3 and lead frame 2 through or in openings 6.

Figure 2:
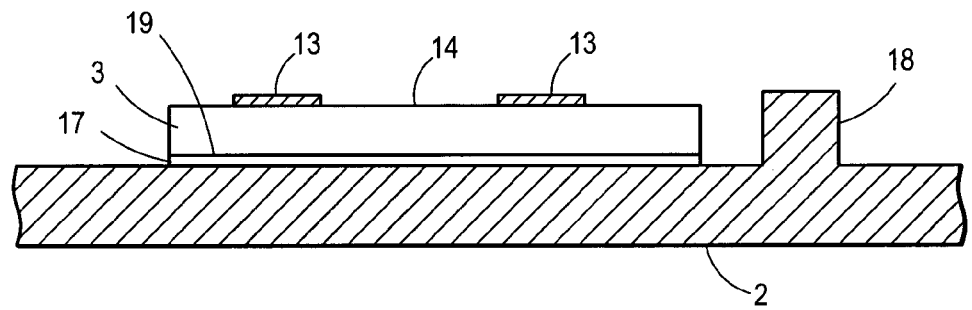
FIG. 2 illustrates an enlarged, cross-sectional view of the embodiment of FIG. 1 taken along reference line 1—1 at an early stage of fabrication.

FIG. 2 illustrates an enlarged cross-sectional view of DCA device 1 at an early stage of fabrication taken along reference line 1—1 of FIG. 1. By way of example, chip 3 comprises a power MOSFET, logic, sensor device, passive device, or bipolar device. Chip 3 includes bond pads or contacts 13 on an upper surface 14. Bond pads 13 comprise, for example, aluminum/aluminum-silicon/aluminum-silicon-copper. Chip 3 is attached to lead frame 2 using conventional techniques such as eutectic die attach, conductive epoxies or soft solder processes to form a die attach layer 17. For example, chip 3 is attached using a lead/tin (Pb/Sn) soft solder process.

As shown FIG. 2, lead frame 2 further includes a flag 18, which provides an upper or top-side contact to lower surface 19 of chip 3. When chip 3 comprises a power MOSFET for example, contacts 13 form source contacts and flag 18 provides a top-side drain contact. Lead frame 2 including flag 18 preferably comprises copper, a copper alloy (e.g., TOMAC 4, TAMAC 5, 2ZFROFC, or CDA194), a copper plated iron/nickel alloy (e.g., copper plated Alloy 42), or the like.

Figure 3:
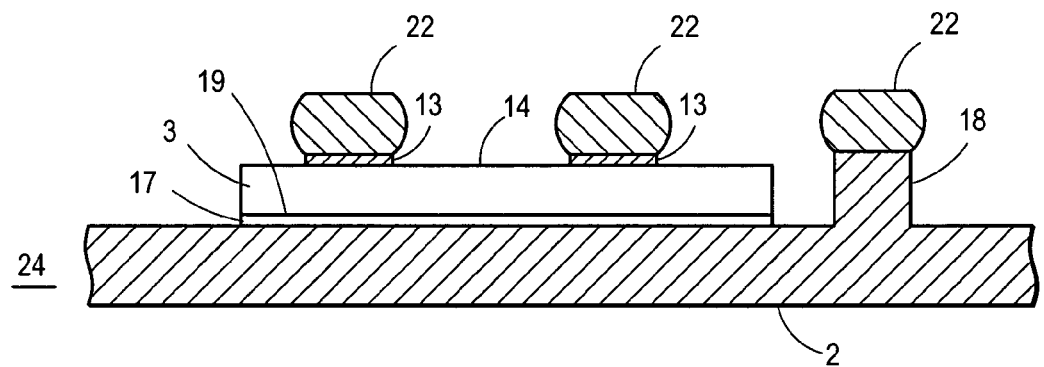
FIG. 3 illustrates an enlarged, cross-sectional view of the embodiment of FIG. 1 at a further stage of fabrication.

Next, as shown in FIG. 3, conductive bumps, balls, or studs 22 are attached to contacts 13. In a preferred embodiment, a conductive stud 22 is also attached to flag 18. In an alternative embodiment, the height of flag 18 is designed to match the height of studs 22 and contacts 13 and a stud 22 is not placed on flag 18.

Conductive studs 22 are attached using, for example, ultrasonic, thermocompression, or thermosonic bonding techniques. Conductive studs 22 comprise, for example, gold or copper. In one embodiment, conductive studs 22 are formed with wire bond balls using conventional wiring bonding techniques. Preferably, any remaining portion of wire above the wire bond ball is removed, which leaves only conductive studs 22 on bond pads 13 and flag 18 as shown in FIG. 3.

Alternatively, conductive studs 22 are formed using solder balls that are reflowed for electrical and mechanical attachment to bond pads 13 and flag 18. In a further embodiment, conductive studs 22 are formed using conductive epoxies. Preferably, conductive studs 22 have a height from about 75 microns to about 1,500 microns. Once conductive studs 22 are attached, a sub-assembly 24 is formed.

Figure 4:
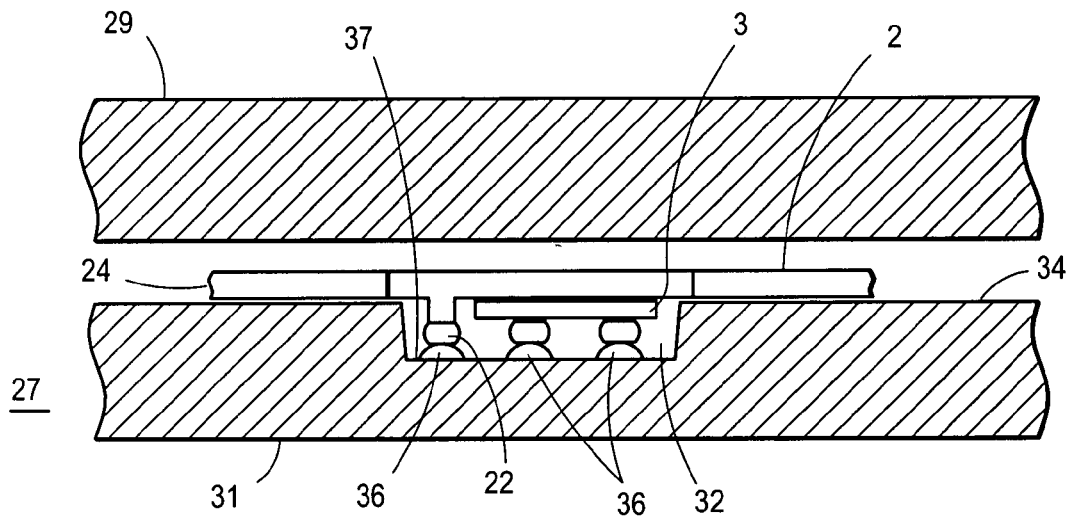
FIG. 4 illustrates an enlarged, cross-sectional view of an apparatus according to the present invention for forming the embodiment of FIG. 1.

FIG. 4 shows an enlarged cross-sectional view of sub-assembly 24 at the beginning of a next stage of processing. Sub-assembly 24 is placed into a molding apparatus 27 for encapsulation. Molding apparatus 27 includes an upper half, upper plate, or first half 29 and a lower half, lower plate, or second half 31. In a preferred embodiment, lower plate 31 further includes a cavity, well or well portion 32 formed in an upper or major surface 34 for receiving or accommodating chip 3 and flag 18.

According to the present invention, well 32 includes pins, studs, protrusions, or bumps 36 formed, coupled, or attached on surface 37 of well 32. For example, pins 36 are formed when surrounding material is removed from lower plate 31 during the fabrication or machining of well 32. That is, pins 36 and lower plate 31 are machined from a single piece of material. Alternatively, pins 36 are attached to surface 37 using welding or brazing techniques. In a preferred embodiment, pins 36 comprise carbon steel.

Figure 5:
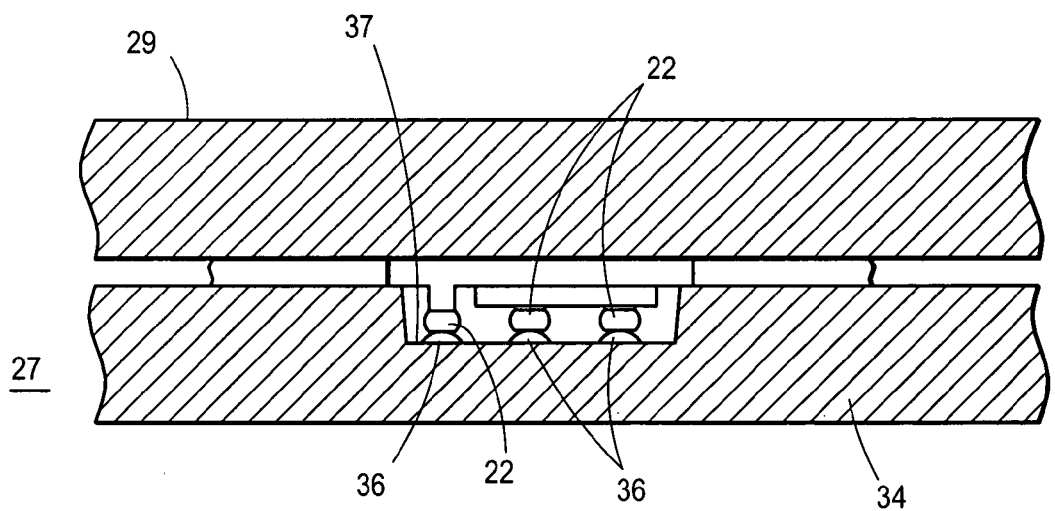
FIG. 5 illustrates another enlarged, cross-sectional view of the apparatus FIG. 4.
Figure 6:
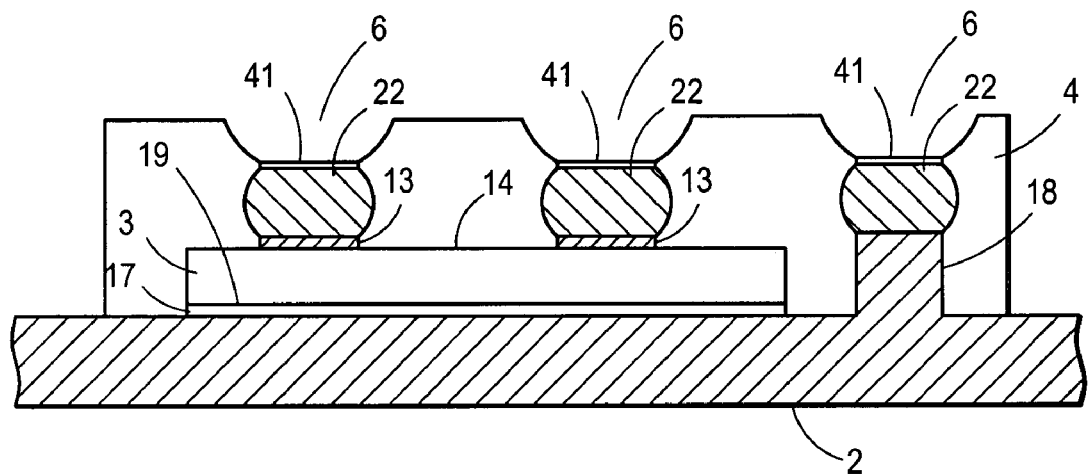
FIG. 6 illustrates an enlarged, cross-sectional view of the embodiment of FIG. 1 at a subsequent stage of fabrication.

According to the present invention, pins 36 are formed or placed in well 32 in locations that align with conductive studs 22 on sub-assembly 24 so that when upper plate 29 is lowered against sub-assembly 24, pins 36 are in contact with studs 22 as shown in FIG. 5. The contact provides a mask or blocking structure or device that prevents mold compound or encapsulating material from covering the upper surface of studs 22 to form openings 6 during the molding or encapsulating step. In alternative embodiment, the cavity and pins are formed in upper plate 29 and sub-assembly 24 is flipped up when placed in molding apparatus 27.

Mold compound is then injected into well 32 using conventional means to encapsulate chip 3 and flag 18 to form protective layer 4 shown in FIG. 1. Protective layer 4 comprises, for example, an epoxy novolac-based resin.

In a preferred embodiment, and as shown in FIG. 4, the upper surfaces of pins 36 are flat with the upper edges chamfered or rounded to provide a beveled or rounded edge in openings 6 of DCA device 1. This is more clearly shown in FIG. 6, which is an enlarged cross-sectional view of sub-assembly 24 after the molding process step. The beveled or chamfered edge provides for enhanced alignment during the placement of solder balls 9 in openings 6. By way of example, pins 36 have a height on the order of 0.05 to 0.15 millimeters (mm) and a diameter of 0.20 to 0.50 mm when DCA device 1 comprises, for example, a power MOSFET chip. These dimensions are variable and can be adjusted according to individual device and package constraints.

By forming openings 6 during the encapsulation process, molding apparatus 27 is advantageous over other techniques such as laser burning or chemical etching because the need for additional processing equipment and consumables (e.g., chemicals, utilities, etc.) is eliminated. Additionally, this reduces cycle time thus further reducing the manufacturing costs of DCA device 1.

After the molding process, encapsulant 4 is post-cured, and then a barrier layer 41 is formed on studs 22 in openings 6. Preferably, barrier layer 41 comprises a material that is metallurgically compatible with studs 22 and solder balls 9. That is, barrier layer 41 prevents inter-diffusion of the elements of studs 22 and solder balls 9. For example, when studs 22 comprise gold and solder balls 9 comprise lead/tin, barrier layer 41 preferably comprises a nickel layer formed using electroless nickel plating or electrolytic nickel plating.

Figure 7:
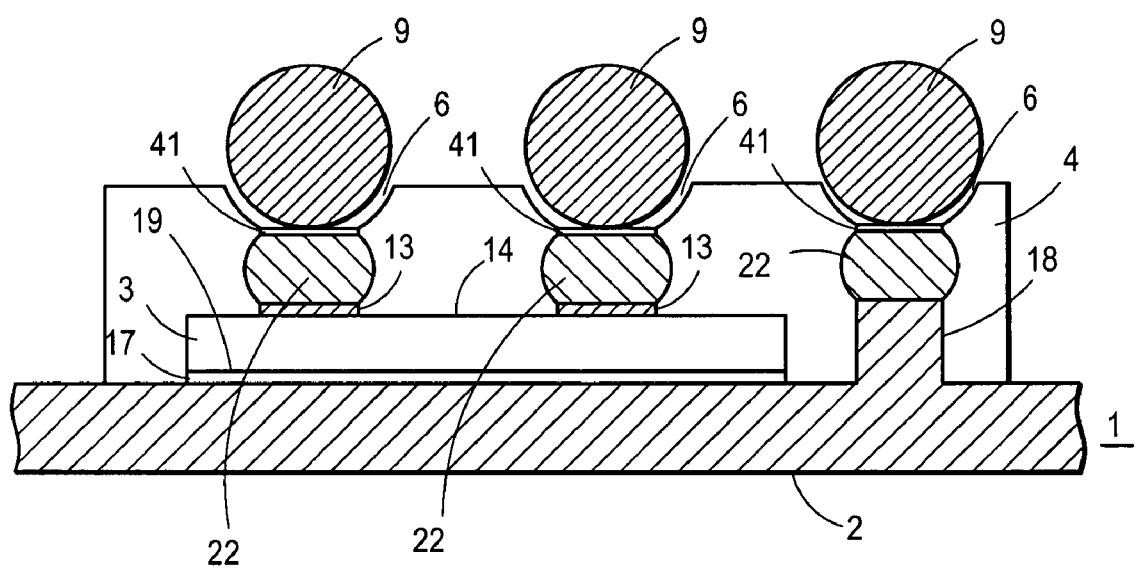
FIG. 7 illustrates an enlarged, cross-sectional view of the embodiment of FIG. 1 at a still further stage of fabrication.

FIG. 7 shows an enlarged cross-sectional view of DCA device 1 after solder balls 9 have been attached. Solder balls 9 comprise, for example, a lead/tin alloy, and are attached using conventional fluxing and re-flow techniques. After re-flow, solder balls 9 typically take-on a half hemisphere shape.

Figure 8:
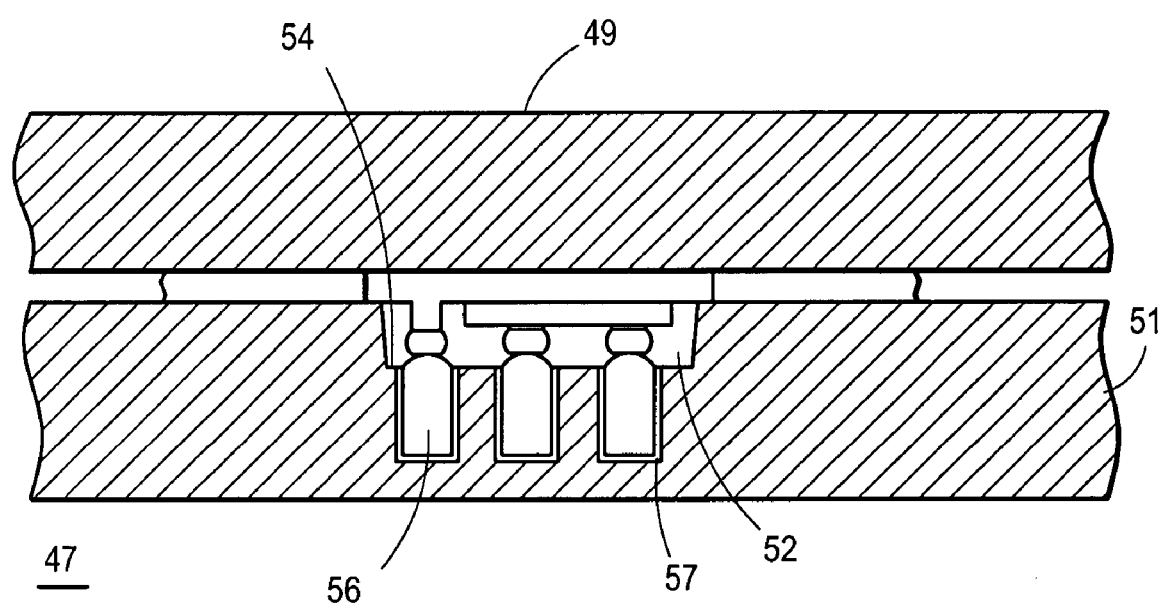
FIG. 8 illustrates an enlarged, cross-sectional view of a second embodiment of an apparatus according to the present invention.

FIG. 8 shows an enlarged cross-sectional view of a molding apparatus 47 according a second embodiment of the present invention. Molding apparatus 47 includes an upper half or plate 49 and a lower half or plate 51. Lower plate further includes a cavity, well or well portion 52 formed in upper surface 54. In this second embodiment, pins 56 are placed in openings 57 formed in well 52. This embodiment allows one to use pins having different tip geometries (e.g., rounded, flat, square, etc.) dependent on specific device and package requirements. Additionally, molding apparatus 47 allows for new pins to be added in a cost-effective manner when older pins wear out or become damaged.

Thus, it is apparent that there has been provided, in accordance with the present invention, a method for forming a direct chip attach device having openings in the molded package to allow for solder ball contact to an encapsulated chip. In addition, a molding apparatus has been provided that includes pins to advantageously form the openings during the molding process. The method and structure provide improvements over other techniques by eliminating processing steps that require expensive equipment and materials.

Although the invention has been described and illustrated with reference to specific embodiments thereof, it is not intended that the invention be limited to these illustrative embodiments. Those skilled in the art will recognize that modifications and variations can be made without departing from the spirit of the invention. For example, molding apparatus 27 can be inverted so that the cavity and the pins are formed in the upper plate. Therefore, it is intended that this invention encompass all such variations and modifications as fall within the scope of the appended claims.

We claim:

1. A method for forming a direct chip attach device comprising the steps of:
    attaching an electronic chip to a lead frame structure, wherein the electronic chip includes a bonding pad;
    attaching a conductive bump to the bonding pad;
    placing the electronic chip and lead frame structure into a molding apparatus, wherein the molding apparatus has a well portion with a removable pin coupled to a first surface of the well portion;
    contacting the removable pin to the conductive bump;
    molding the electronic chip with an encapsulating material, wherein the removable pin masks the conductive bump to provide an opening in the encapsulating material over the conductive bump, and wherein the conductive bump is recessed within the opening; and
    thereafter forming a barrier layer overlying the conductive bump.

2. The method of claim 1 wherein the step of placing the electronic chip and the lead frame structure into the molding apparatus includes placing the electronic chip and the lead frame structure into the molding apparatus, wherein the well portion has a plurality of removable pins to the first surface.

3. The method of claim 1 further comprising the step of coupling a solder ball to the electronic chip in the opening.

4. The method of claim 1 wherein the step of placing the electronic chip and the lead frame structure into the molding apparatus includes placing the electronic chip and the lead frame structure into the molding apparatus, wherein the removable pin has a flat upper surface and rounded upper edges.

5. The method of claim 1, wherein the step of attaching the electronic chip to the lead frame structure includes attaching a power MOSFET device.

6. A process for forming a flip-chip device comprising the steps of:
 placing a sub-assembly into a mold apparatus having a cavity, wherein the sub-assembly comprises an electronic chip attached to a support substrate, and wherein the electronic chip has a first conductive stud coupled to the electronic chip;
 contacting the first conductive stud with a first blocking device in the cavity;
 injecting an encapsulating material into the cavity to encapsulate the electronic chip, wherein the first blocking device masks the first conductive stud to form an opening in the flip-chip device, wherein the opening comprises a chamfered edge, and wherein the first conductive stud is recessed within the opening; and
 forming a barrier layer overlying the first conductive stud.

7. The process of claim 6 further comprising the step of attaching a solder ball to the flip-chip device in the opening.

8. The process of claim 6 wherein the step of contacting the first conductive stud includes contacting the first conductive stud with a removable pin coupled to the mold apparatus.

9. The method of claim 8, wherein the step of contacting includes contacting the first conductive stud with a removable pin having a flat upper surface and rounded upper edges to form the chamfered opening.

10. The method of claim 6, wherein the step of placing the sub-assembly includes placing a sub-assembly having an electronic chip attached to a support substrate, wherein the support substrate includes a flag.

11. The method of claim 10, further comprising the step of contacting the flag with a second blocking device in the cavity.

12. The method of claim 6, wherein the step of placing the sub-assembly includes placing a sub-assembly comprising a power MOSFET device attached to a support substrate.

13. The method of claim 6, wherein the step of placing the sub-assembly includes placing a sub-assembly having an electronic chip attached to a support substrate, wherein the support substrate includes a flag with a second conductive stud attached to the flag.

14. The method of claim 13, further comprising the step of contacting the second conductive stud with a second blocking device in the cavity.

15. A method for forming a semiconductor device comprising the steps of:
 placing a sub-assembly into a mold apparatus having a cavity, wherein the sub-assembly comprises an electronic chip attached to a support substrate, and wherein the electronic chip has a first conductive stud coupled thereto, and wherein the support substrate further includes a flag having a second conductive stud coupled thereto;
 contacting the first conductive stud with a first blocking device in the cavity;
 contacting the second conductive stud with a second blocking device in the cavity;
 injecting an encapsulating material into the cavity to encapsulate the electronic chip and the flag, wherein the first blocking device masks the first conductive stud to form a first opening having a chamfered edge in the encapsulating material and overlying the first conductive stud, and wherein the second blocking device masks the second conductive stud to form a second opening having a chamfered edge in the encapsulating material and overlying the second conductive stud;
 forming a barrier layer overlying the first and second conductive studs;
 attaching a first solder ball to the first conductive stud through the first opening, wherein the chamfered edge of the first opening is configured to enhance alignment of the first solder ball in the first opening; and
 attaching a second solder ball to the second conductive stud through the second opening, wherein the chamfered edge of the second opening is configured to enhance alignment of the second solder in the second opening.

16. The method of claim 15, wherein the step of forming the barrier layer includes forming a barrier layer comprising nickel.

17. The method of claim 15, wherein the step of contacting the first conductive stud with the first blocking device includes contacting the first conductive stud with a removable pin having a flat contact surface and rounded edges adjacent the flat contact surface.

* * * * *

UNITED STATES PATENT AND TRADEMARK OFFICE
CERTIFICATE OF CORRECTION

PATENT NO. : 7,144,538 B2 Page 1 of 1
APPLICATION NO. : 10/603257
DATED : December 5, 2006
INVENTOR(S) : Yeu Wen Lee et al.

It is certified that error appears in the above-identified patent and that said Letters Patent is hereby corrected as shown below:

Column 5, line 3, insert the word --coupled-- between "pins" and "to".

Signed and Sealed this

Twenty-fifth Day of December, 2007

JON W. DUDAS
*Director of the United States Patent and Trademark Office*